United States Patent
Humpston et al.

(10) Patent No.: US 8,624,342 B2
(45) Date of Patent: Jan. 7, 2014

(54) REAR-FACE ILLUMINATED SOLID STATE IMAGE SENSORS

(75) Inventors: Giles Humpston, Buckinghamshire (GB); Moshe Kriman, Tel-Aviv (IL)

(73) Assignee: Invensas Corporation, San Jose, CA (US)

( * ) Notice: Subject to any disclaimer, the term of this patent is extended or adjusted under 35 U.S.C. 154(b) by 582 days.

(21) Appl. No.: 12/940,326

(22) Filed: Nov. 5, 2010

(65) Prior Publication Data

US 2012/0112301 A1 May 10, 2012

(51) Int. Cl.
*H01L 31/02* (2006.01)

(52) U.S. Cl.
USPC ...... 257/433; 257/E31.11; 257/774; 257/773; 257/E23.011

(58) Field of Classification Search
USPC ............ 257/774, 773, E23.011, E31.11, 433
See application file for complete search history.

(56) References Cited

U.S. PATENT DOCUMENTS

| | | | |
|---|---|---|---|
| 5,518,964 A | 5/1996 | DiStefano | |
| 6,168,965 B1 | 1/2001 | Malinovich et al. | |
| 6,624,505 B2 | 9/2003 | Badehi | |
| 6,646,289 B1 | 11/2003 | Badehi | |
| 6,777,767 B2 | 8/2004 | Badehi et al. | |
| 6,972,480 B2 | 12/2005 | Zilber et al. | |
| 2004/0183185 A1 | 9/2004 | Badihi | |
| 2007/0190691 A1 | 8/2007 | Humpston et al. | |
| 2007/0190747 A1 | 8/2007 | Humpston et al. | |
| 2008/0116537 A1* | 5/2008 | Adkisson et al. | 257/448 |
| 2010/0006963 A1 | 1/2010 | Brady | |
| 2010/0007030 A1* | 1/2010 | Koike et al. | 257/774 |
| 2010/0025791 A1 | 2/2010 | Ogawa et al. | |
| 2010/0059802 A1 | 3/2010 | Chen | |
| 2010/0213560 A1 | 8/2010 | Wang et al. | |

OTHER PUBLICATIONS

U.S. Appl. No. 12/221,204.
U.S. Appl. No. 12/393,233.
U.S. Appl. No. 12/583,830.
U.S. Appl. No. 11/603,935.
International Search Report and Written Opinion, PCT/US2011/057645, dated Jan. 31, 2012.

\* cited by examiner

*Primary Examiner* — Marc Armand
(74) *Attorney, Agent, or Firm* — Lerner, David, Littenberg, Krumholz & Mentlik, LLP

(57) ABSTRACT

A microelectronic unit includes a semiconductor element having a front surface to which a packaging layer is attached, and a rear surface remote from the front surface. The element includes a light detector including a plurality of light detector element arranged in an array disposed adjacent to the front surface and arranged to receive light through the rear surface. The semiconductor element also includes an electrically conductive contact at the front surface connected to the light detector. The conductive contact includes a thin region and a thicker region which is thicker than the thin region. A conductive interconnect extends through the packaging layer to the thin region of the conductive contact, and a portion of the conductive interconnect is exposed at a surface of the microelectronic unit.

30 Claims, 19 Drawing Sheets

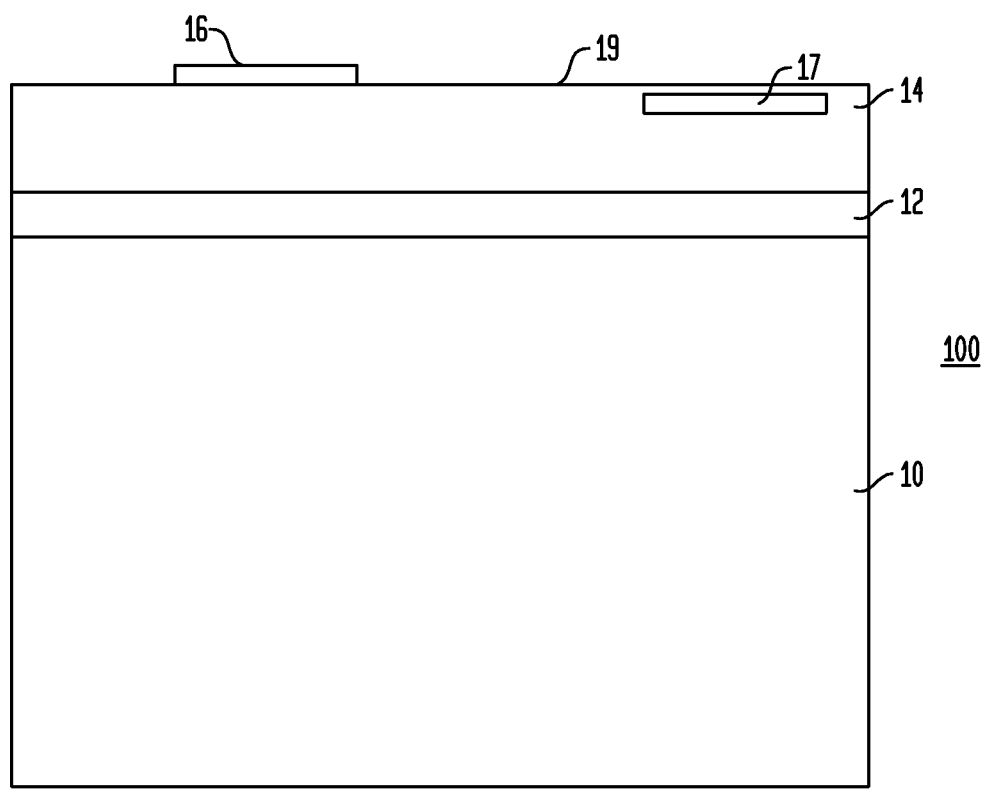

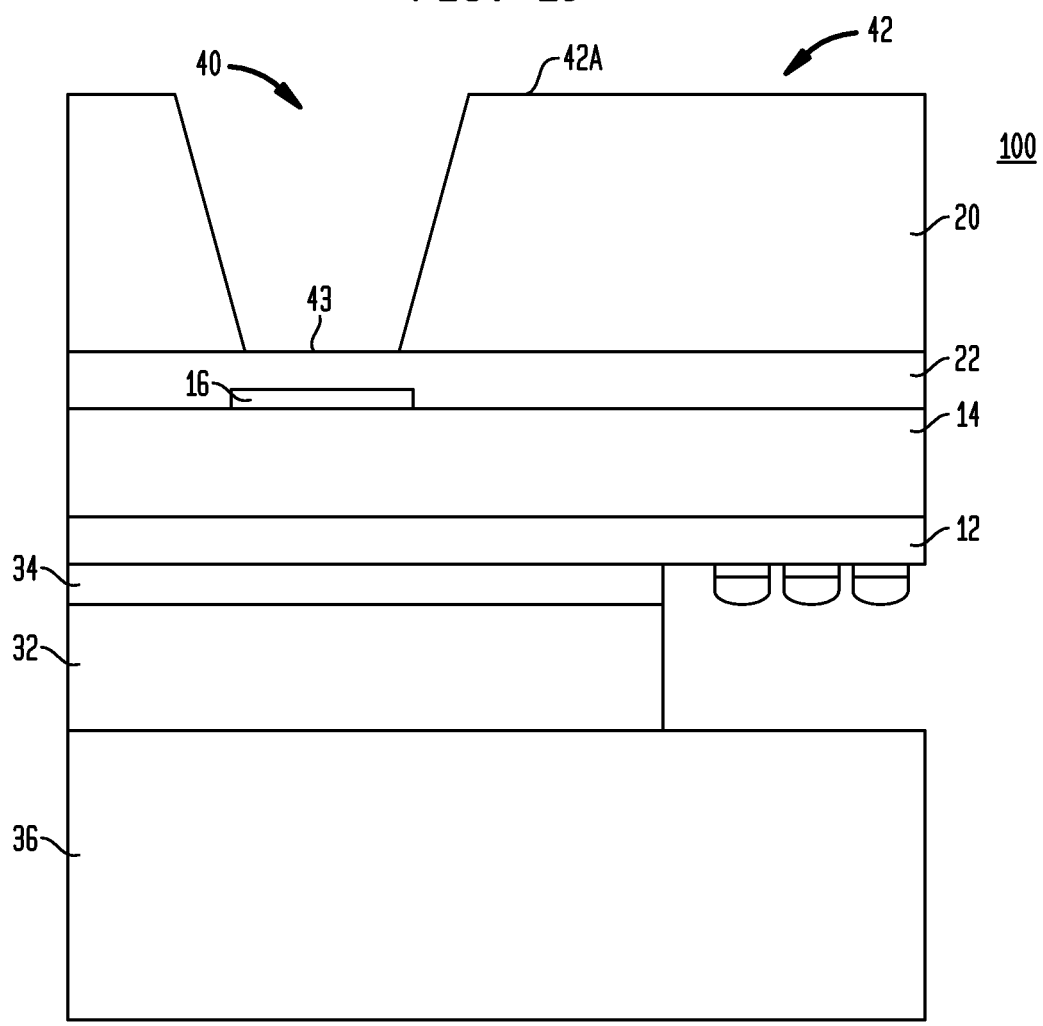

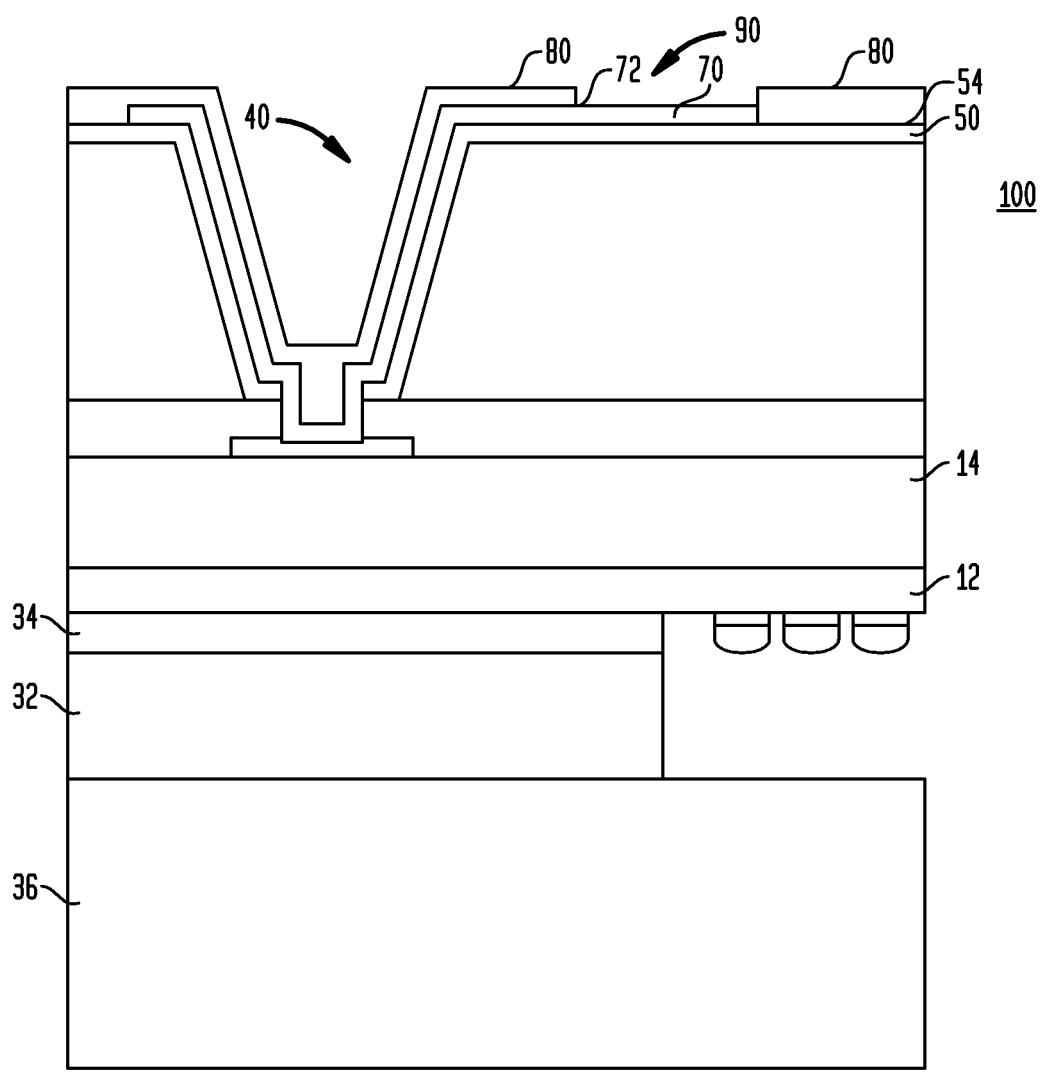

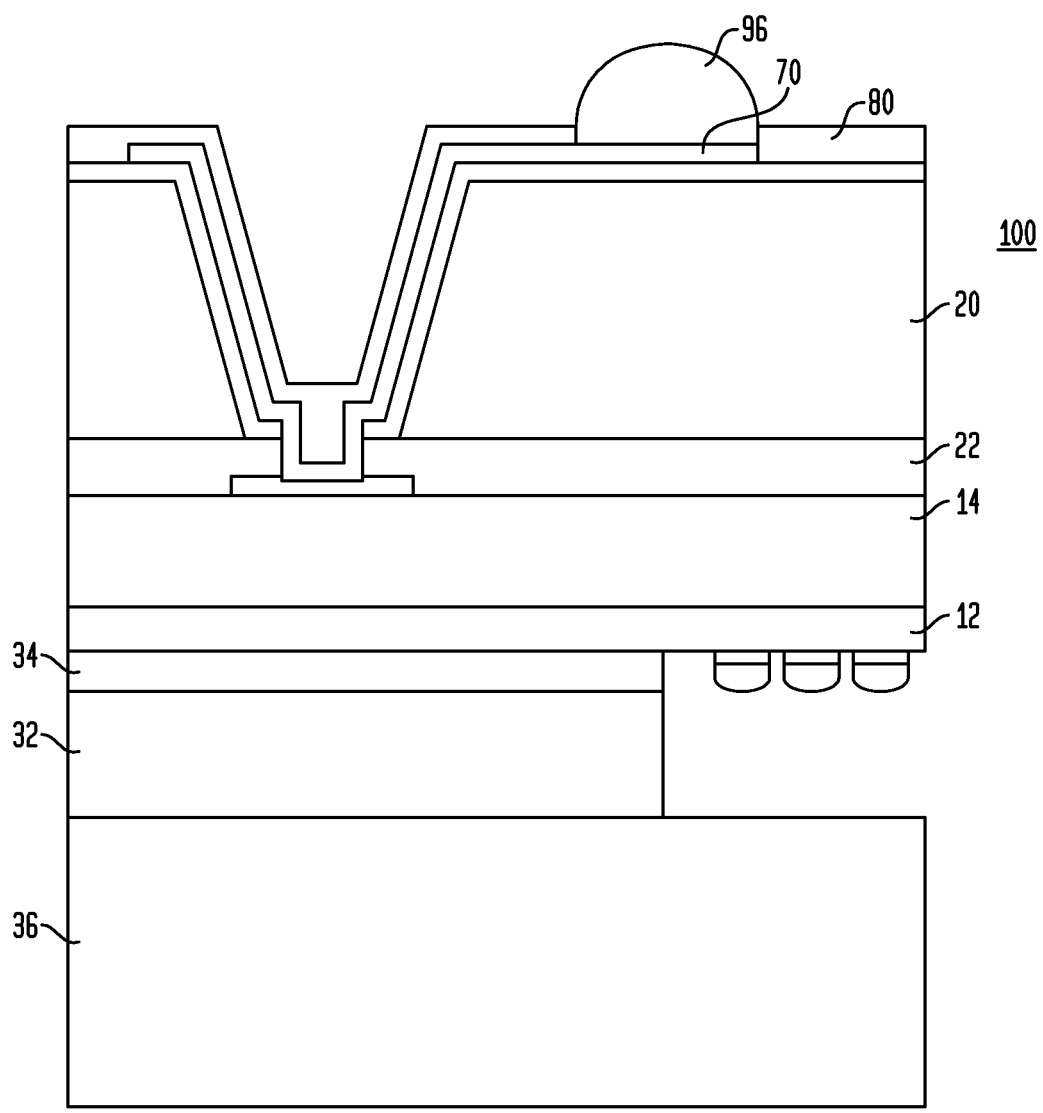

REAR-FACE ILLUMINATED SOLID STATE IMAGE SENSORS

BACKGROUND OF THE INVENTION

The subject matter shown and described in the present application relates to microelectronic image sensors and methods of fabricating, e.g., microelectronic image sensors.

Solid state image sensors, e.g. charge-coupled devices, ("CCD") arrays, have a myriad of applications. For instance, they may be used to capture images in digital cameras, camcorders, cameras of cell phones and the like. One or more light detecting elements on a chip, along with the necessary electronics, are used to capture a "pixel" or a picture element, a basic unit of an image.

Improvements can be made to the structure of solid state image sensors and the processes used to fabricate them.

SUMMARY OF TEE INVENTION

In accordance with one embodiment, a microelectronic unit may include a semiconductor element having a front surface and a rear surface remote from the front surface, and a packaging layer attached to the front surface of the semiconductor element. The semiconductor element may include a light detector, which includes a plurality of light detector elements arranged in an array, disposed adjacent to the front surface and aligned with a portion of the rear surface to receive light through the rear surface portion, and a conductive contact at the front surface connected to the light detector. The conductive contact may include a thin region having a first thickness and a thicker region having a second thickness that is thicker than the first thickness. A conductive interconnect may extend through the packaging layer to the thin region of the conductive contact, and at least a portion of the conductive interconnect is exposed at a surface of the microelectronic unit.

In another embodiment, a method of fabricating a microelectronic unit may include forming a recessed portion extending through a packaging layer attached to a front surface of a semiconductor element and terminating at a thin region of a conductive contact. The conductive contact is disposed at the front surface of the semiconductor element. The semiconductor element has a rear surface remote from the front surface and includes a light detector including a plurality of light detector elements arranged in an array. The light detector is disposed adjacent to the front surface, connected to the conductive contact and aligned with a portion of the rear surface to receive light through the rear surface portion. In addition, the conductive contact has a first thickness at the thin region and includes a thicker region having a second thickness that is thicker than the first thickness. The method further may include forming a conductive interconnect extending through the recessed portion to connect to the conductive contact at the thin region, where at least a portion of the conductive interconnect is exposed at a surface of the microelectronic unit.

In accordance with another embodiment, a microelectronic unit may include a semiconductor element having a front surface, a rear surface remote from the front surface and a region consisting essentially of semiconductor material disposed between the front and rear surfaces. A first packaging layer may be attached to the front surface of the semiconductor element. The semiconductor element may include a light detector, which includes a plurality of light detector elements arranged in an array, disposed adjacent to the front surface and aligned with a portion of the rear surface to receive light through the rear surface portion. A conductive contact at the front surface is connected to the light detector. A packaging assembly having a second packaging layer may be attached to the rear surface of the semiconductor element. A conductive interconnect may extend through the first packaging layer, through the conductive contact and into the second packaging layer, and is connected to the conductive contact. The conductive interconnect is electrically isolated from the semiconductor region, and at least a portion of the conductive interconnect is exposed at a surface of the microelectronic unit.

In one embodiment, an isolation region in the semiconductor element completely circumscribes the conductive contact so as to electrically isolate the conductive contact from the semiconductor region.

DETAILED DESCRIPTION

In an embodiment of the present invention, a wafer level package assembly is disclosed having a back side illuminated image sensor. U.S. Pat. No. 6,646,289, which is hereby incorporated by reference, discloses integrated circuit devices employing a thin silicon substrate. Optronic components are formed on a surface facing away from a corresponding transparent protective layer.

As discussed in the '289 patent, the thinness of the silicon allows for the optronic components to be exposed to light impinging via the transparent protective layer. Color filters may be formed on an inner surface of the protective layer. Further, an array of microlenses may also be disposed on an inner surface of the protective layer.

Figure 1A:
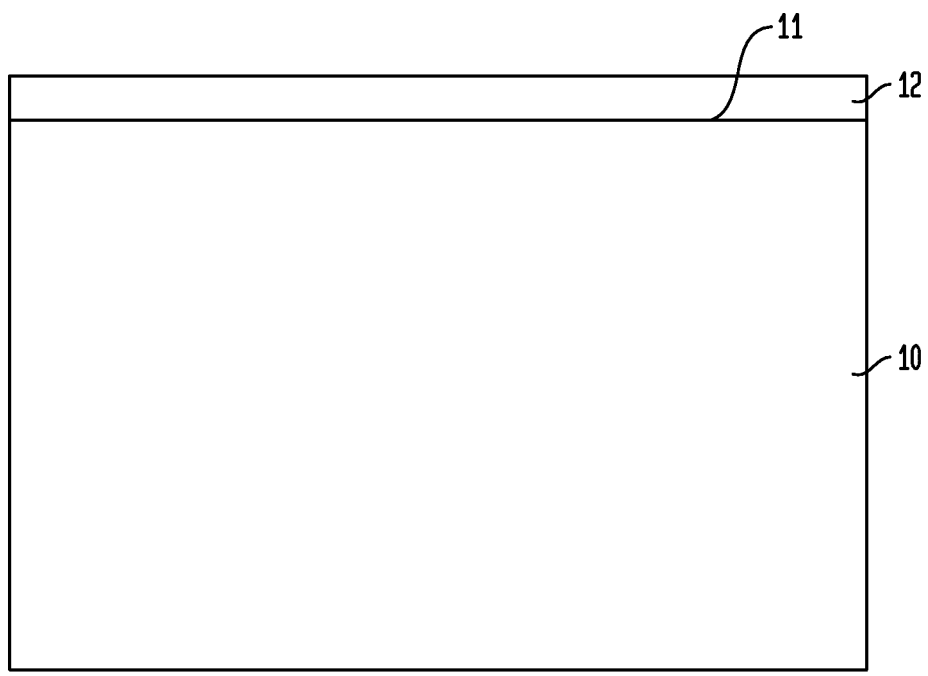
FIGS. 1A-1O are partial sectional views illustrating stages in a method of fabricating a back side illuminated image sensor, according to an embodiment of the invention.

A method of fabricating a back side illuminated image sensor will now be described with reference to sectional views illustrating respective stages of fabrication in FIGS. 1A-through 1O. As illustrated in FIG. 1A, in a preliminary stage of fabrication before a packaging process is performed, a semiconductor material wafer 10 is provided, and a process stop layer 12 is disposed on a surface 11 of the wafer 10. The wafer 10 may consist essentially of silicon, and alternatively may include other semiconductor materials such as, for example, germanium (Ge), carbon (C), alloys or combinations of silicon with such material or one or more III-V compound semiconductor materials, each being a compound of a Group III element with a Group V element of the periodic table. In one embodiment, the layer 12 can have a thickness of about 1-5 μm and consist essentially of silicon dioxide.

Figure 1B:
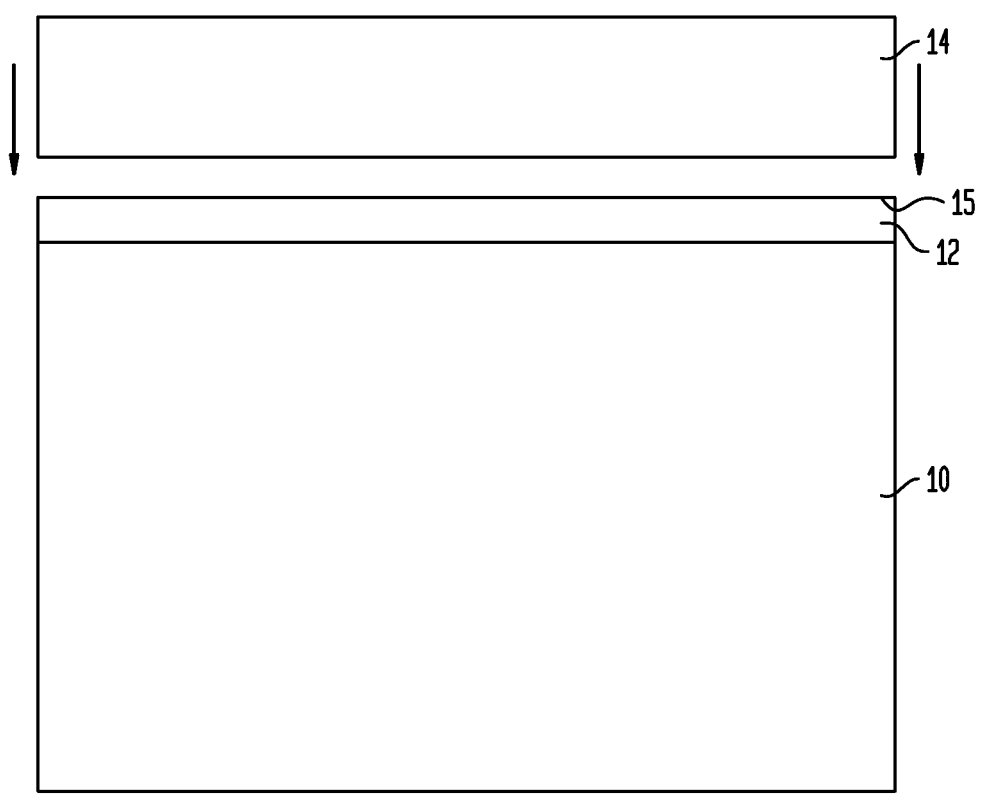

Referring to FIG. 1B, a semiconductor device wafer 14 made from the same or similar materials as the wafer 10 is joined with the wafer 10 at exposed surface 15 of the layer 12.

Figure 1C:
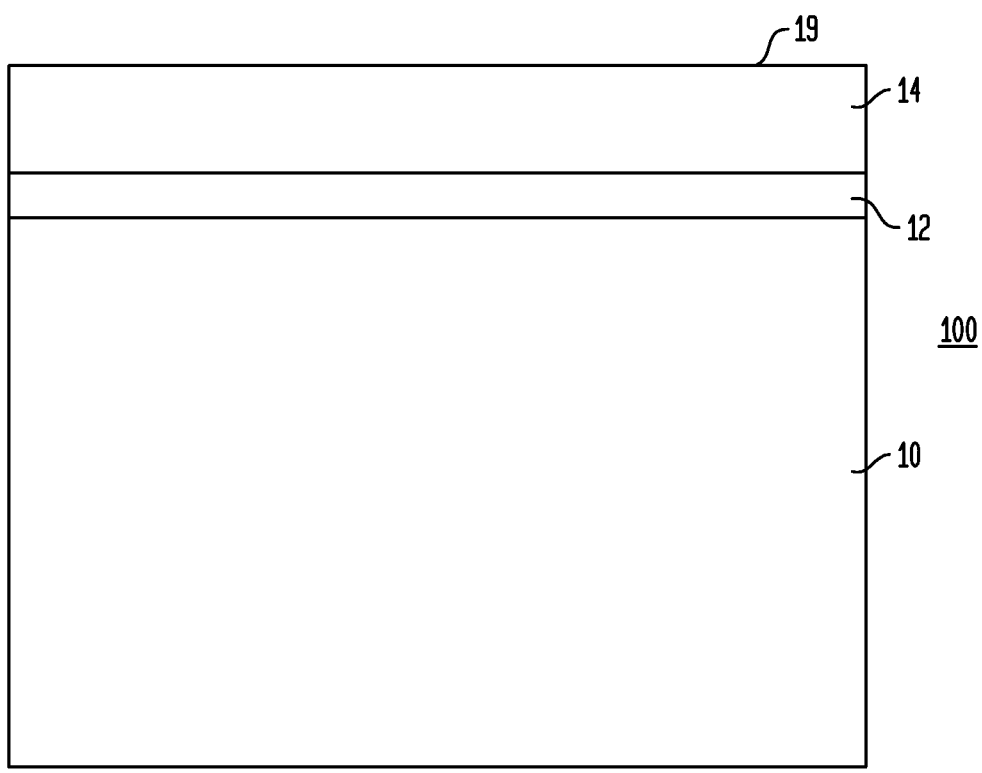

Referring to FIG. 1C, after the wafers 10 and 14 are joined, the thickness of the wafer 14 is reduced, such as by grinding or smart cutting of the wafer 14.

The wafer 14 includes an active semiconductor layer or an active region which can consist essentially of silicon. Although not shown in the drawings FIGS. 1A-1O, the wafer 14 includes a plurality of adjoining dies, each constituting an image sensing region. Referring to FIG. 1D, each sensing region includes an image sensor 17 formed in the active region. The image sensor includes a plurality of light detector elements typically arranged in an array to form one or more picture elements (pixels) for capturing an image cast thereon via light in directions normal to front or back surfaces of the wafer 14. In one example, the image sensor can be a charge-coupled device ("CCD") array. In another example, the image sensor can be a complementary metal oxide semiconductor ("CMOS") device array. Each of the sensing regions or dies of the wafer 14 will be severed from each other at a later stage of fabrication. For highlighting the features of the present invention, a portion of a single image sensing region of a microelectronic assembly 100 including the wafer 14 is shown in the drawings FIGS. 1A-1O. Although fabrication processing of the assembly 100 is described below with respect to a single image sensing region of the assembly 100, it is to be understood that the same fabrication processing occurs in the other image sensing regions of the assembly 100.

In one embodiment, the wafer 14 may be reduced to a final thickness that is the same as a lateral dimension of a pixel, which is formed in the sensor 17, in a lateral direction along a surface of the wafer 14. In other embodiments, the wafer 14 has a final thickness of about 3-5 μm.

Still referring to FIG. 1D, after the thickness of the wafer 14 is reduced, a bond pad 16 is formed on a front surface 19 of the wafer 14. The bond pad 16 optionally may overlie a dielectric layer (not shown) disposed at the front surface 19.

As used in this disclosure, terms such as "top", "bottom", "upward" or "upwardly" and "downward" or "downwardly" refer to the frame of reference of the microelectronic element, e.g., semiconductor wafer or chip, or an assembly or unit which incorporates such wafer or chip. These terms do not refer to the normal gravitational frame of reference. For ease of reference, directions are stated in this disclosure with reference to the "top" or "front" surface 19 of the device wafer 14. Generally, directions referred to as "upward" or "rising from" shall refer to the direction orthogonal and away from the front surface 19. Directions referred to as "downward" shall refer to the directions orthogonal to the front surface 19 and opposite the upward direction. A "vertical" direction shall refer to a direction orthogonal to the chip front surface. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

As used in this disclosure, a statement that an electrically conductive structure is "exposed at" a surface of a dielectric structure indicates that the electrically conductive structure is available for contact with a theoretical point moving in a direction perpendicular to the surface of the dielectric structure toward the surface of the dielectric structure from outside the dielectric structure. Thus, a terminal or other conductive structure which is exposed at a surface of a dielectric structure may project from such surface; may be flush with such surface; or may be recessed relative to such surface and exposed through a hole or depression in the dielectric.

Figure 1E:
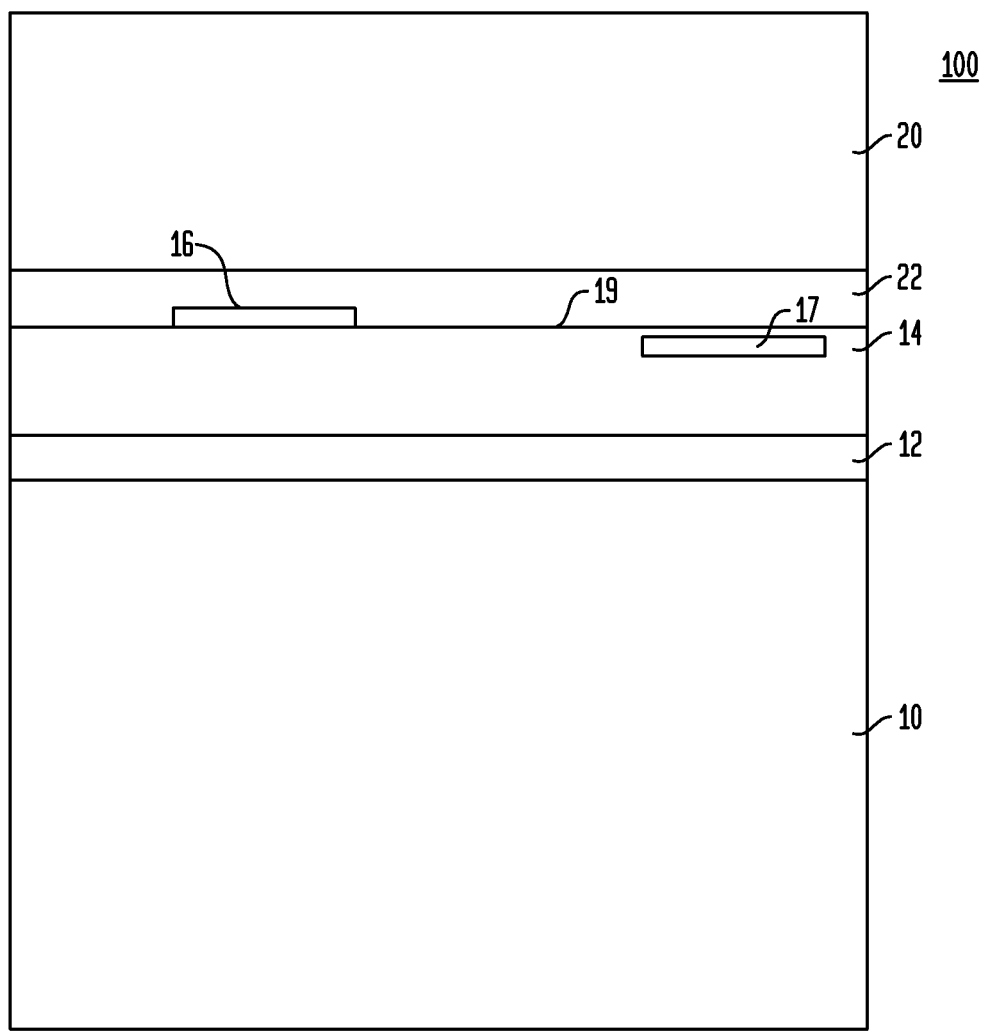

Referring to FIG. 1E, a carrier wafer or packaging layer 20 is joined to the wafer 14 at the front surface 19 using an adhesive 22. The adhesive 22 can be any suitable material, and can be epoxy. The adhesive 22 should have properties and a glass transition temperature $T_g$ sufficiently high to withstand the maximum heating to be encountered during subsequent thermal processing. The adhesive 22 may cover the front surface 19. Preferably, the adhesive is homogeneously applied by spin bonding, as described in U.S. Pat. Nos. 5,980,663 and 6,646,289, the disclosures of which are incorporated herein by reference. Alternatively, any other suitable technique may be employed. In another embodiment, an oxide/nitride layer may be used to join the packaging layer 20 to the device wafer 14.

The layer 20 may be made from materials, such as silicon, glass or ceramic, so as to have a coefficient of thermal expansion matched to the coefficient of thermal expansion of the device wafer 14. In one example, the packaging layer 20, when initially joined to the wafer 14, can have a thickness of about 500-1000 μm.

Figure 1F:
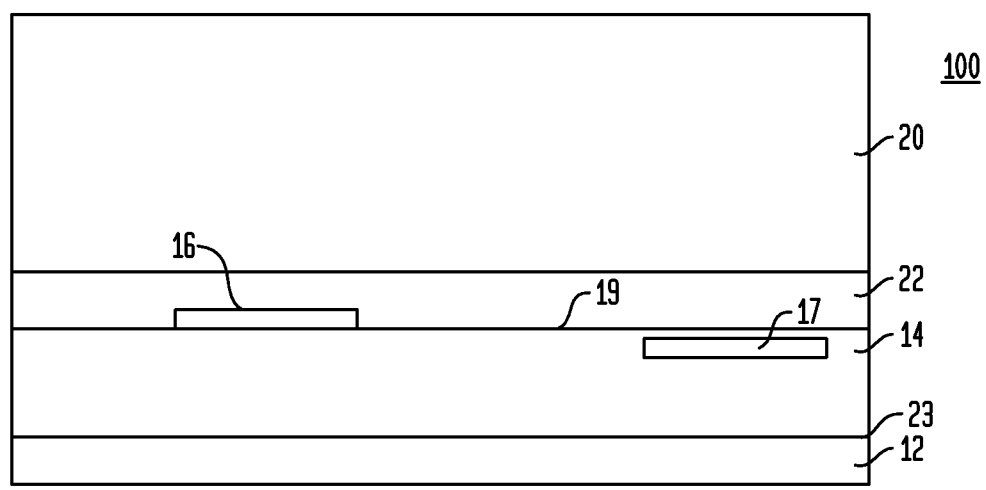

Referring to FIG. 1F, the wafer 10 of the assembly 100 is completely removed, such as by etching and/or grinding. In one embodiment, the wafer 10 is initially mechanically ground or lapped to remove all but a few microns of thickness of the wafer 10, and then etching is performed to remove the remaining few microns of the wafer 10. The layer 12 of the assembly 100 can serve as an etch stop, in other words, can prevent etching (removal) of portions of the device wafer 14 containing the image sensing regions, when the wafer 10 is removed.

In a particular embodiment, after mechanically grinding the layer 10 to a thickness of a few microns, chemical and/or mechanical polishing may be performed to remove the remaining thickness of the layer 10.

In an alternative embodiment, after the bulk layer 10 is completely removed, the layer 12 can be completely removed and then another layer of material, such as a transparent dielectric which may have a controlled thickness, can be provided on exposed back surface 23 of the device wafer 14. In one example, the replacement transparent layer can include an anti-reflective layer.

Figure 1G:
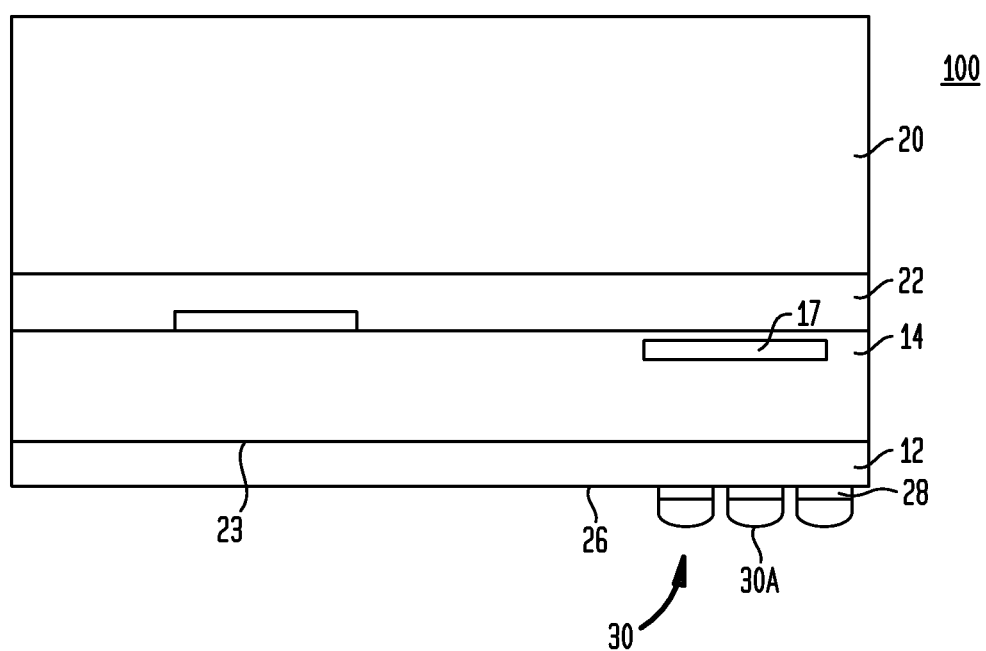
Figure 1H:
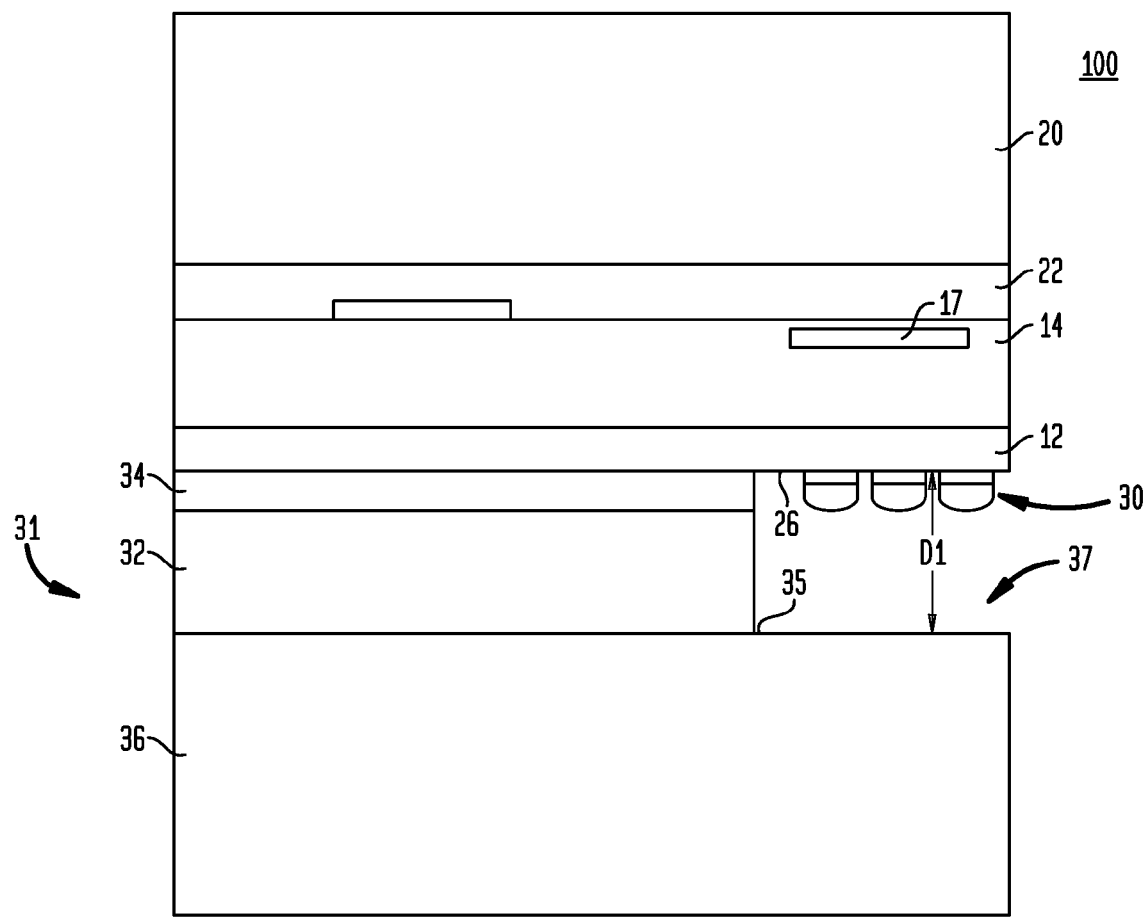

Referring to FIG. 1G, in cases in which layer 12 is not removed, an anti-reflective coating (not specifically shown) may be formed on exposed back surface 26 of the dielectric layer 12. The anti-reflective coating can help reduce the amount of light reflected from the surface 23 of the wafer 14 and improve contrast ratio. The anti-reflective coating may include silicon dioxide, magnesium fluoride and/or indium tin oxide.

A color filter array including color filters 28 may then be formed or laminated overlying the surface 26. The color filters 28 can be used to separate wavelengths of light arriving thereto into different ranges of wavelengths that correspond to different ranges of color, and provide that the light separated by wavelength propagates from the color filters towards the back surface 23 of the device wafer 14. Through use of a variety of different color filters, each aligned with a pixel or pixels of the image sensor 17 in the wafer 14, each color filter and pixel can be used to sense only a limited predefined range of wavelengths corresponding to a particular range of colors. In such way, an array of undifferentiated light detector elements can be used with an appropriate combination of color filters geared to transmitting different colors to permit many different combinations of colors to be detected.

Sets of microlenses 30 may then be formed which overlie an exposed surface of the array of color filters 28. The microlenses 30 include tiny bumps of refractive material arranged in an array which help to focus light on one or more pixels of the imaging sensor of the device wafer 14. The light arriving at exposed surface 30A of the microlenses 30 is directed primarily onto one or more corresponding pixels.

As further illustrated in FIG. 1E, a packaging layer 32 constituting a sidewall or standoff of a packaging assembly 31 may be attached to the back surface 26 of the dielectric layer 12 using an adhesive 34. The sidewall 32 can be applied so as not to vertically overlie the region of the assembly 100 including the lenses 30. The sidewall 32 can be made from dielectric material. In addition, a lid or covering wafer 36 is joined to back surface 35 of the sidewall 32. The sidewall 32 may be attached to the layer 12, and then the lid wafer 36 is attached to the sidewall 32. Alternatively, the sidewall 32 and lid wafer 36 are first attached to each other, and then the sidewall 32 with the lid wafer 36 is attached to the layer 12. The sidewall 32 and the lid wafer 36, together, define a cavity 37 in which the filters and microlenses associated with a sensing region of the device 14 are encapsulated.

The lid wafer 36 is at least partially transmissive to wavelengths of interest to the light detector elements incorporated in the image sensor 17, and may be formed from one or more various types of glass, and may include inorganic or organic materials, or a combination thereof. The cavity 37 may have a height or vertical dimension D1 extending between the back surface 26 of the layer 12 and the opposing surface of the lid wafer 36, where D1 is about 35-40 μm. For a detailed description of a packaging assembly joined to a back side of an image sensor, see, for example, '830 application, incorporated by reference herein.

Figure 1I:
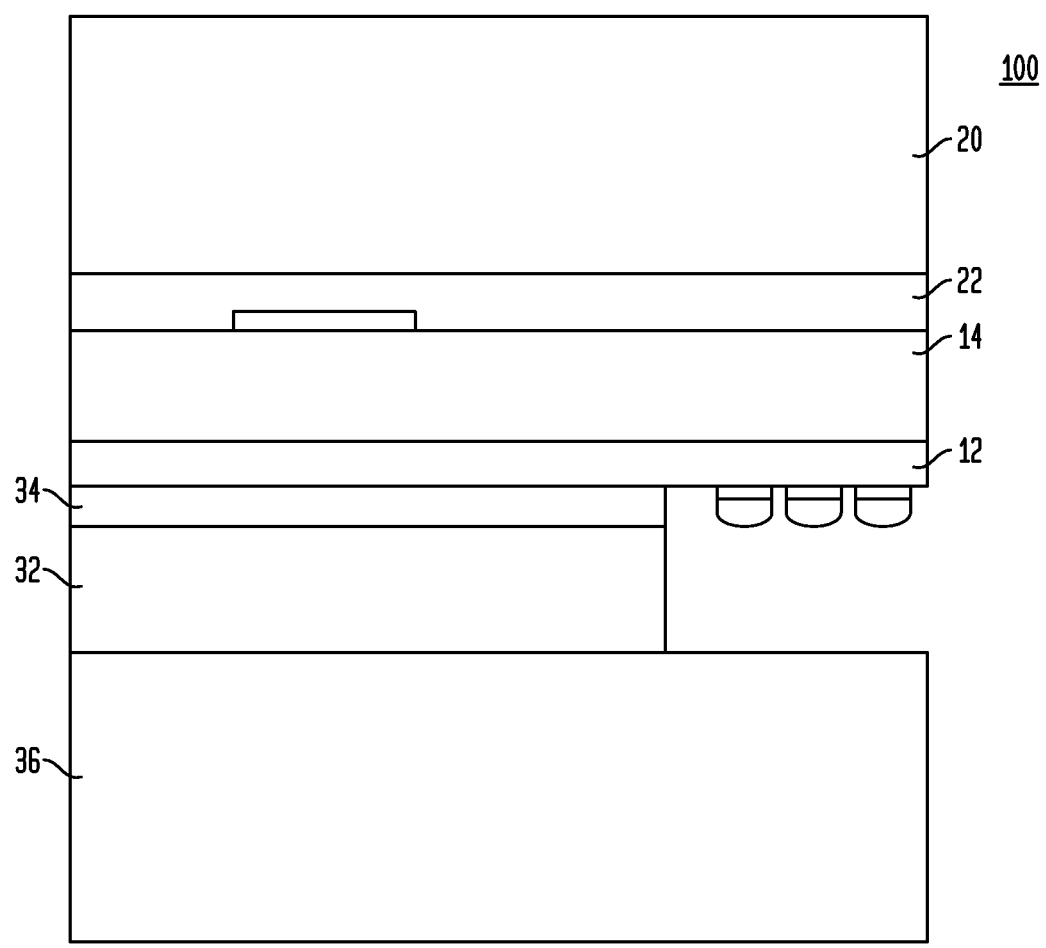

As illustrated in FIG. 1I, after mounting of the lid wafer 36 to the device wafer 14, the packaging layer 20 may be ground to a thickness of not less than about 30 μm. The layer 20 has a final thickness so that it has sufficient rigidity to serve as a mechanical support for the assembly 100.

As illustrated in FIG. 1J, a recess 40 may be formed in front surface 42 of the packaging layer 20. The recess 40 extends inwardly from an outer surface 42A of the layer 42 to an inner surface 43 of the adhesive 22. In one embodiment, photolithography may be used to form mask patterns (not shown) overlying the front surface 42 of the layer 20, after which the layer 20 may be etched from the front surface 40 using wet or dry etching. The adhesive 22 functions as an etch stop layer that avoids etching of the device wafer 14 when the recess 40 is formed. In an alternative embodiment, the recess 40 may be formed by laser ablation of the layer 20. In another embodiment, the layer 20 may be sandblasted using a directed stream of particles, such as disclosed in commonly owned co-pending U.S. application Ser. No. 12/842,612 filed Jul. 23, 2010, incorporated by reference herein, to form the recess 40.

In one embodiment, the recess 40 may be a discrete via hole or notch formed at a location that overlies only the bond pad 16. In another alternative embodiment, the recess 40 may be in the form of a channel that extends continuously across the surface 43 of the adhesive layer 22 of the assembly 100. See, for example, U.S. patent application Ser. No. 12/072,508 filed Feb. 26, 2008, and U.S. patent application Ser. No. 12/583,830 filed Aug. 26, 2009, incorporated by reference herein.

Figure 1K:
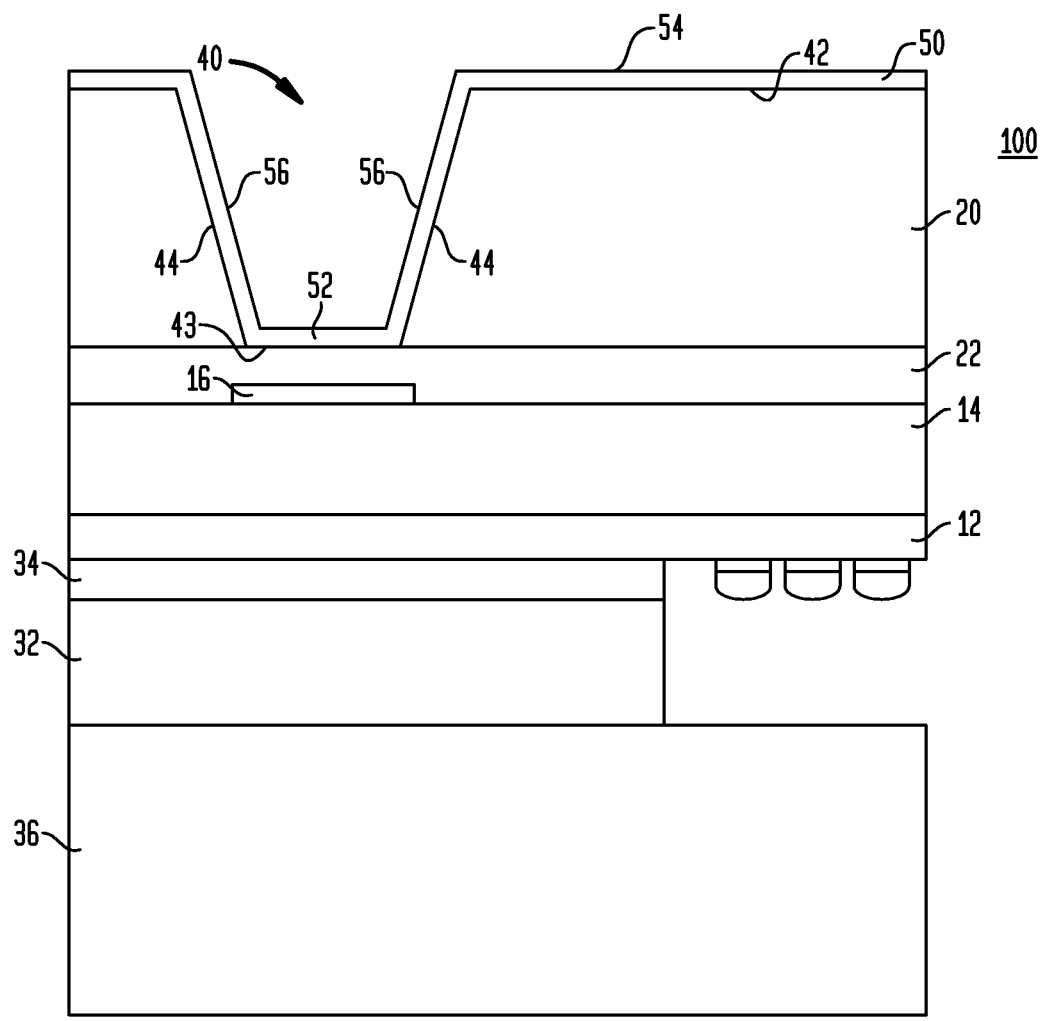

As illustrated in FIG. 1K, a polymer or passivation layer 50 is formed over all of the exposed front surfaces of the assembly 100, which include the front surface 42 of the packaging layer 20, sidewall surfaces 44 of the layer 20 within the recess 40 and the exposed portion of the inner surface 43 of the adhesive 22 at the bottom of the recess 40. Referring to FIG. 1K, the layer 50 includes a lower portion 52 on the surface 43 of the adhesive 42 and which overlies the bond pad 16, an upper portion 54 on the front surface 42 of the layer 20 and sidewall portions 56 on the sidewall surfaces 44 of the layer 20. The layer 50 may be formed, for example, by spray or spin coating, electrolytic or electrophoretic deposition, oxide chemical vapor deposition or plasma enhanced chemical vapor deposition. The layer 50 may be formed with sufficient thickness to provide compliancy, or alternatively may be a non-compliant layer, such as an oxide layer. See U.S. patent application Ser. No. 12/583,830 filed Aug. 26, 2009, incorporated by reference herein.

Figure 1L:
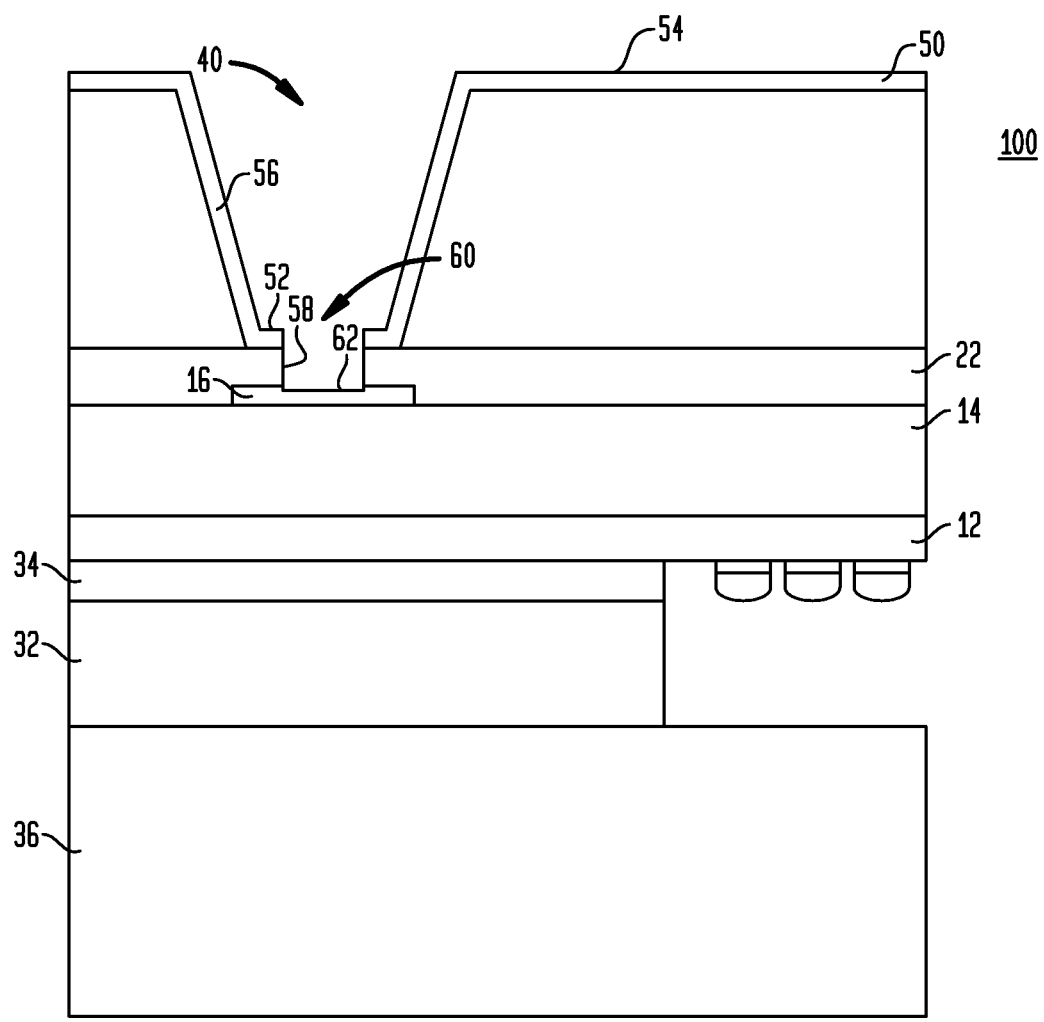

As illustrated in FIG. 1L, a recess 60 may be formed through the lower portion 52 of the layer 50. The recess 60 extends vertically through the layer 50, the underlying adhesive 22 and to and into the bond pad 16. The recess 60 may extend only partially into the bond pad 16. In one embodiment, a thickness of less than a micron of the bond pad 16 is removed at the front surface of the bond pad 16 when the recess 60 is formed. The recess 60 may be formed by controlled laser etching or ablation, where the pulse width, intensity, number and wavelength are suitably controlled to ablate vertically through all or some portion of the portion 52 of the layer 50, the portion of the adhesive 22 underlying and vertically aligned with the ablated portion 52 of the layer 50 and a predetermined thickness of the bond pad 16 underlying and vertically aligned with the ablated portion of adhesive 22. See, for example, U.S. patent application Ser. No. 12/221,204, filed Jul. 31, 2008, incorporated by reference herein.

In another embodiment, the ablation depth into the bond pad 16 does not exceed ten percent of the thickness of the bond pad. In a further embodiment, the ablation depth into the bond pad may extend to fifty percent or more of the thickness of the bond pad. The ablation of the metal surface of the bond pad advantageously provides that metal free of contamination is exposed, such that a reliable and low resistance ohmic contact may be formed for an interconnect metal that is subsequently applied, as described below in connection with the FIG. 1M.

In one embodiment, the recess 60 may extend completely through the bond pad 16 when an active component of the device wafer 14 does not underlie the bond pad 16.

Figure 1M:
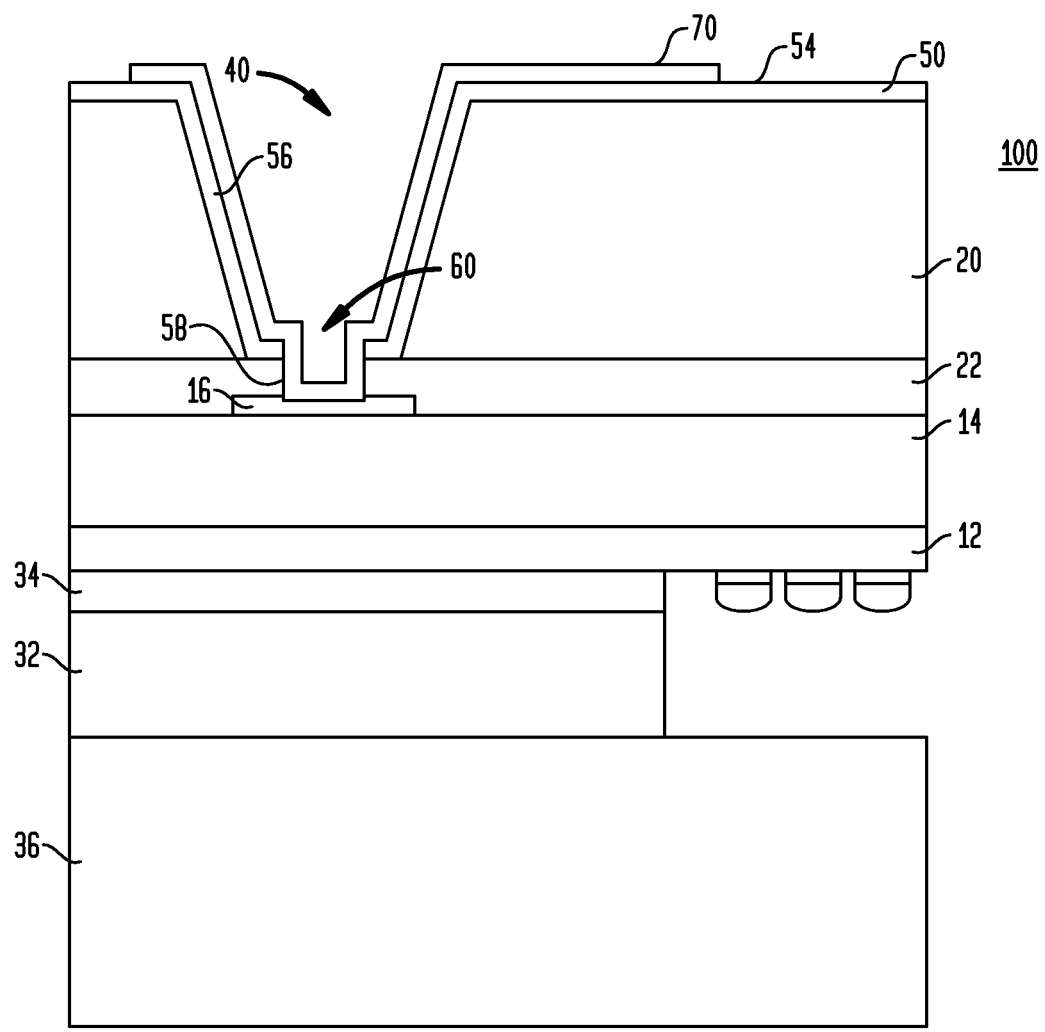

Referring to FIGS. 1L and 1M, a seed metal layer 70 is selectively formed on the exposed surface of the upper portion 54 of the passivation layer 50, and also is formed on exposed surfaces of the layer 50 within the recess 40 and the recess 60, exposed surfaces 58 of the adhesive layer 22 within the recess 60 and the exposed surface of the bond pad 16. The layer 70 may be formed by sputtering or blanket metallization, and followed by surface patterning using photolithography. See U.S. patent application Ser. No. 11/603,935, filed Nov. 22, 2006, incorporated by reference herein. Alternatively, the seed metal layer 70 may be formed by electroless plating.

As illustrated in FIG. 1N, a masking dielectric layer 80 is formed patterned on the exposed surface of the upper portion 54 of the layer 50, and on exposed front surface 72 of the layer 70, to define solder bump locations 90. In addition, the layer 80 is formed on exposed surfaces of the layer 70 within the recesses 40 and 60. In one embodiment, the material of the layer 80 may fill the entirety of the recess 40, as well as the recess 60.

As illustrated in FIG. 1O, solder bumps 96 may be formed at the locations 90 on the layer 70 at which the solder mask 80 is not present. See, for example, '830 application, incorporated by reference herein.

In one embodiment, a packaged image sensor unit manufactured in accordance with the method of FIGS. 1A-1O may be singulated into individual packaged chip assemblies 100 which constitute microelectronic units, each containing an active region, such as described, for example, in the '830 application.

Figure 2:
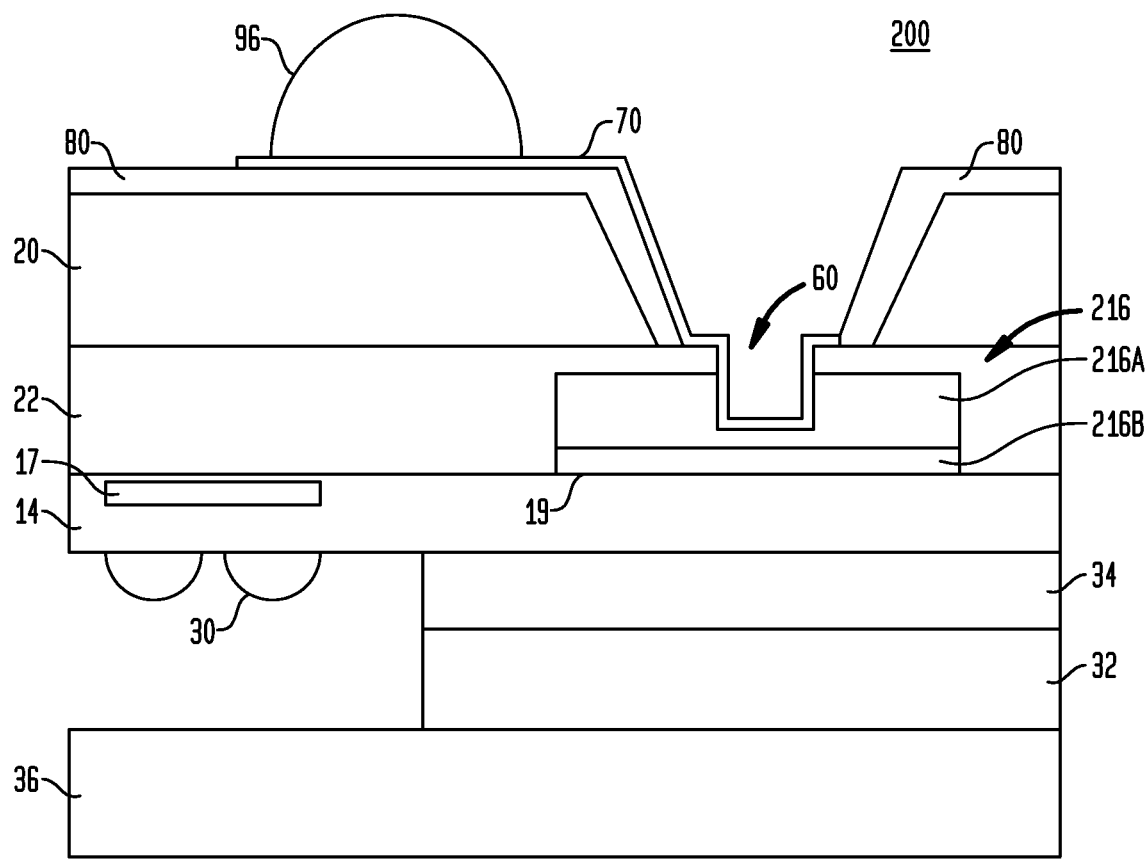
FIG. 2 is a sectional view illustrating a packaged back side illuminated image sensor, according to an embodiment of the invention.

In another embodiment of the invention, referring to FIG. 2, a bond pad 216 of increased thickness in relation to the bond pad 16 of the assembly 100 may be provided on a device wafer 14 of a microelectronic assembly 200. The assembly 200, with the exception of the bond pad 216, has a construction similar to the construction of the assembly 100, and like reference numerals designate the same or similar elements. The bond pad 216 includes a layer of metal 216B that contacts the front surface 19 of the device wafer 14, and a layer of metal 216A disposed over the metal layer 216B. The layers 216A, 216B provide that the bond pad 216 has a thickness extending away from the front surface 19 that is almost as thick as the subsequently applied adhesive 22. The recess 60 may be formed so as to terminate within the metal layer 216A of the bond pad 216. The recess 60 desirably does not extend into the metal layer 216B, which has a thickness that is about the same as the thickness of the bond pad 16 of the assembly 100.

The bond pad 216 has a greater thickness than the bond pad 16 to provide that the recess 60, and thus, the metal layer 70, formed during the packaging process, terminate within the bond pad 216 and do not contact the device wafer 14. As a result, an active region of the wafer device 14, such as the sensor 17, is electrically isolated from the metal layer 70 within the recess 60. In one embodiment, the fabrication of the assembly 200 may be performed in substantially the same manner as described above for the assembly 100, except that the bond pad 216 is provided by forming the metal layer 216A over the metal layer 216B after the metal layer 216B is formed on the front surface 19 of the device wafer 14.

The bond pad 216 may have a thickness that is substantially greater than 0.5 um, and may include a metal or other material resistant to laser ablation. For example, the metal used for the layer 216A may be more resistant to laser ablation than aluminum, from which the layer 216B is formed. Nickel, copper, gold, silver or like materials are desirable for formation of the layer 216A based on their resistance to laser ablation, low cost and ease of deposition by standard electroless plating process.

In one embodiment, the bond pad 216 may include the layer 216A formed from nickel, copper, gold or silver disposed over the layer 216B formed from aluminum. In one embodiment, the thickness of the layer 216A may be greater than fifty percent of the thickness of the bond pad 216. The thickness of the layer 216A may be between 3-5 μm, and may be between 0.5-30 μm.

It to be understood that, in accordance with the present invention, a bond pad of increased thickness may be formed in a front side illuminated sensor assembly, which has the active region and the bond pads on the same face, and where the assembly is inverted during further fabrication steps.

Figure 3:
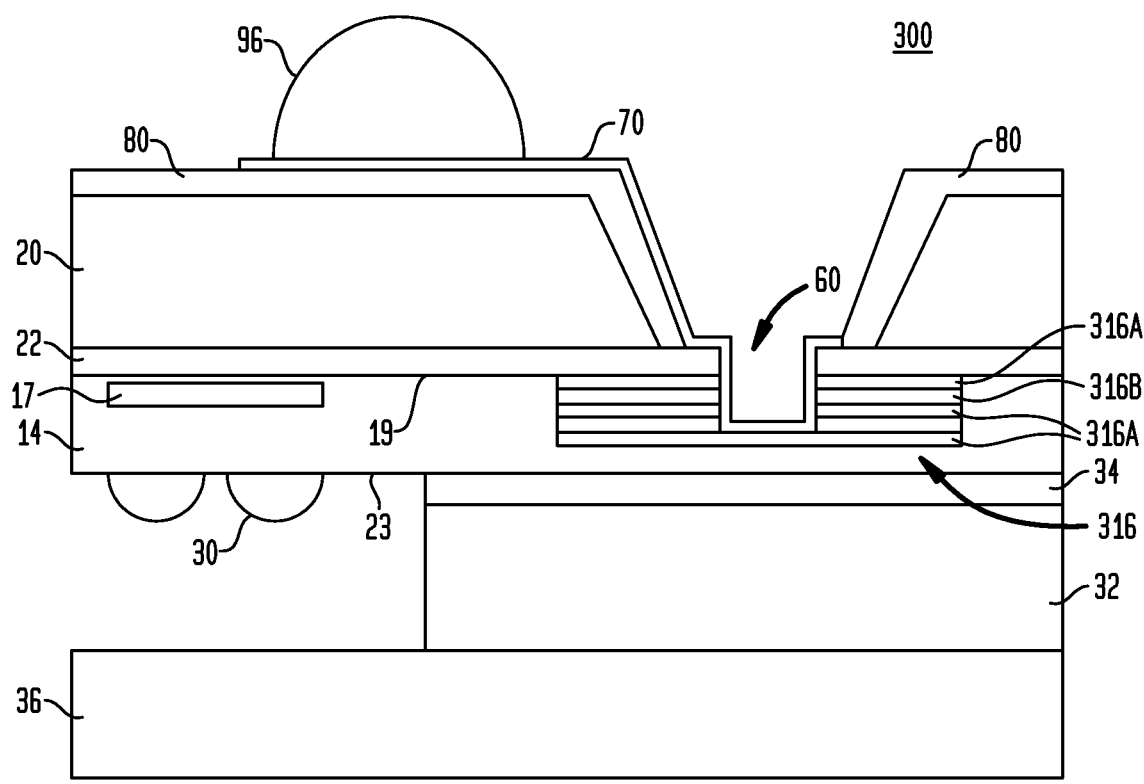
FIG. 3 is a sectional view illustrating a packaged back side illuminated image sensor, according to another embodiment of the invention.

In a further embodiment of the invention, referring to FIG. 3, a bond pad 316 having multiple levels or layers may be provided within a device wafer 14 included in a microelectronic assembly 300. The assembly 300, except for the bond pad 316, has a construction similar to the construction of the assembly 100, and like reference numerals designate the same or similar elements. The bond pad 316 may be fabricated as part of a sequence of steps performed to form the pixels of the image sensor 17. The bond pad 316 includes several layers of metal 316A, and each metal layer 316A may have a construction that is the same or similar to a single layer bond pad, such as the bond pad 16 of the assembly 100 described above. The layers 316A are connected to each other by conductive vias 316B or other conductive vertical structures. In one embodiment, the metal layers 316A and the vias 316 may be isolated from semiconductor material in the wafer 14. The bond pad 316 may be fabricated recessed partly or wholly within the wafer 14, as shown in FIG. 3, or alternatively may be formed on the surface 19 of the wafer 14. The recess 60 is desirably formed to extend into the bond pad 316 to a depth not greater than the back surface of the metal layer 316A of the bond pad 316 which is closest to the back surface 23 of the wafer 14. As a result, an active region of the wafer device 14, such as the sensor 17, is electrically isolated from the metal layer 70 within the recess 60. The fabrication of the assembly 300 may be performed in substantially the same manner as described above for the assembly 100, except for the formation of the bond pad 316 within the device wafer 14.

Figure 4:
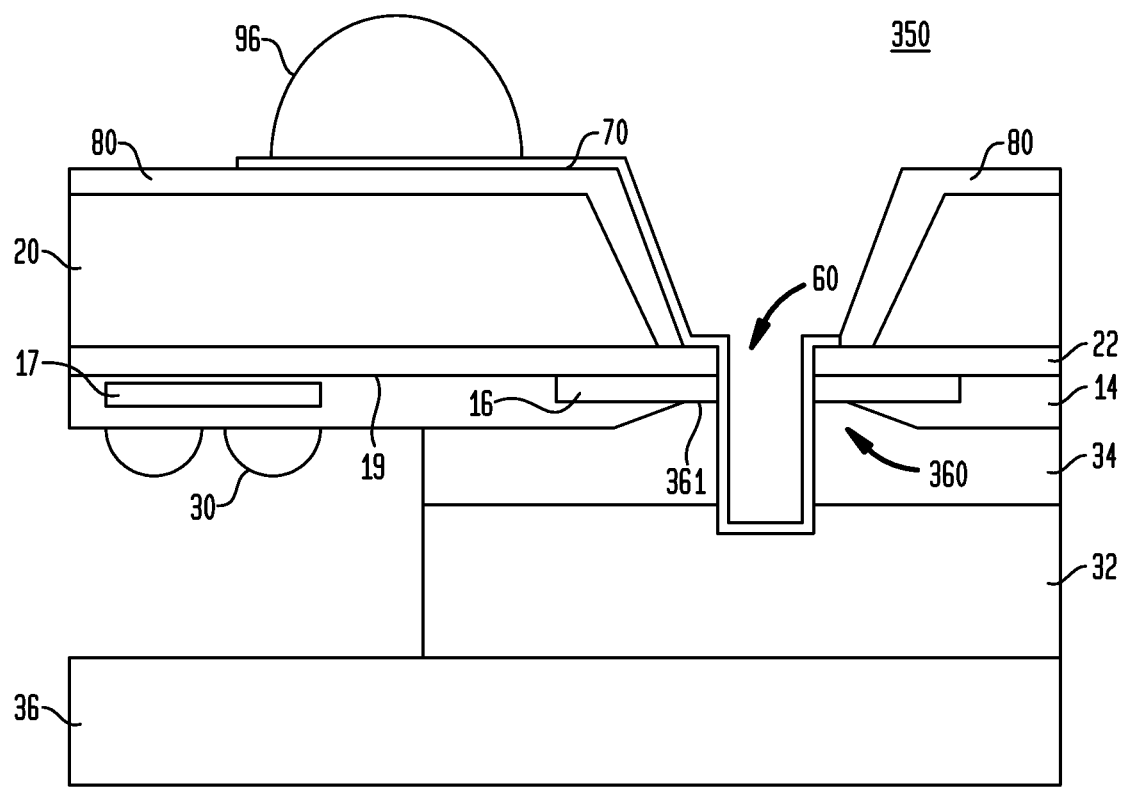
FIG. 4 is a sectional view illustrating a packaged back side illuminated image sensor, according to another embodiment of the invention.

In another embodiment of the invention, referring to FIG. 4, in a microelectronic assembly 350 an electrical isolation region 360 extends away from a rear surface 361 of a bond pad 16 and a rear surface 19 of a device wafer 14. The assembly 350 has a construction similar to the construction of the assembly 100, and like reference numerals designate the same or similar elements. The region 360 is partially defined by a portion of the rear surface 361 of the bond pad 16 that completely circumscribes the portion of the bond pad 16 through which the recess 60 is formed. The region 360 may be filled with dielectric material, such as silicon dioxide, and may be a part of the sidewall 32. Alternatively, the region 360 may be filled with the same adhesive material used to attach the sidewall 32 to the wafer 14.

The material within the region 360 electrically isolates the metal layer 70 extending along the sidewalls of the recess 60 from an active region, such as the sensor 17, of the wafer 14. As discussed above, the metal layer 70 desirably is in contact with the bond pad 16 at a radially symmetric contact region of the bond pad 16 in the recess 60. The region 360 provides that the metal layer 70 is electrically isolated from the wafer 14. As illustrated in FIG. 4, the recess 60 may be formed to extend through the entirety of the bond pad 16, and also may extend through one or more material layers underlying the bond pad 16, such as the material in the region 360, the adhesive layer 34 and/or the sidewall 32.

The fabrication of the assembly 350 may be performed in substantially the same manner as described above for the assembly 100, except that, before attachment of the sidewall 32, the layer 12 may be removed and then the region 360 underlying the bond pad 16 is formed by removing a portion of the wafer 14, such as by use of photolithography and etching. Desirably, the region 360 is formed after the thickness of the device wafer 14 is reduced.

Figure 5:
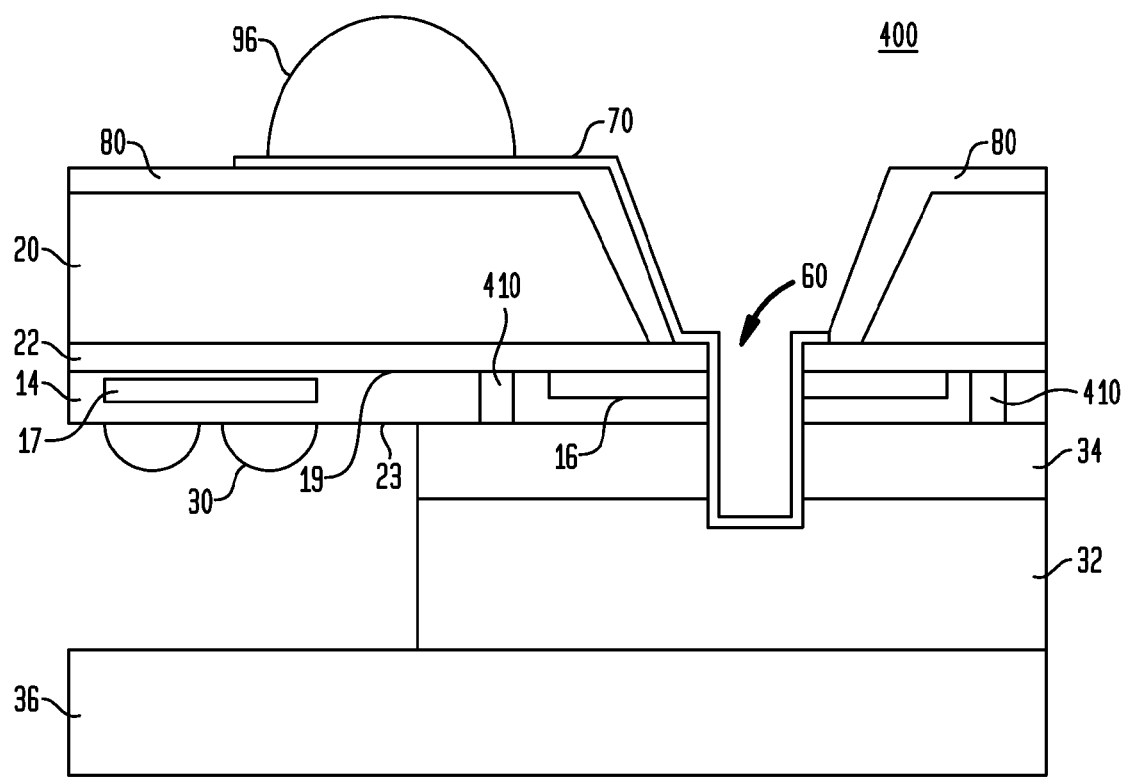
FIG. 5 is a sectional view illustrating a packaged back side illuminated image sensor, according to another embodiment of the invention.

In another embodiment of the invention, referring to FIG. 5, a microelectronic assembly 400 having a construction to similar to the assembly 100 may include an isolation region or trench 410 in a device wafer 14. The assembly 350 has a construction similar to the construction of the assembly 100, and like reference numerals designate the same or similar elements. The trench 410 completely circumscribes the bond pad 16 and extends at least partially, and in one embodiment completely, through the wafer 14.

The trench 410 may be filled with dielectric material. Alternatively, the trench 410 is a doped semiconductor region of the wafer 14 having a different doping than the doping of a semiconductor region of the wafer 14 adjacent to and circumscribed by the trench 410. The difference in the doping between the trench 410 and the adjacent region is adapted such that the trench 410 provides electrical isolation between the adjacent region of the wafer 14 circumscribed by the trench 410, which are on one side of the trench 410, and a region of the wafer 14 on a side of the trench 410 opposite to the recess 60. The doped trench 410, for example, may provide electrical isolation similar to that provided by an intrinsic region (I) of a PIN diode.

The trench 410 electrically isolates a portion of the wafer 14, which extends underneath the bond pad 16 and may contact the metal layer 70 in the recess 60, from the remainder of the wafer 12, which includes imaging elements such as the sensor 17. In effect, the trench 410 is a high resistivity element in the wafer 14 that creates electrical islands within the wafer 14. The trench 410, by circumscribing the bond pad 16, permits that the recess 60 may be formed, using laser etching, to extend through the bond pad 16 and into the wafer 14 beneath the bond pad 16. The trench 410 avoids shorting of active portions of the wafer 14, such as the sensor 17, to the metal layer 70 portions formed in the recess 60.

The fabrication of the assembly 400 may be performed in substantially the same manner as described above for the assembly 100, except that the trench 410 is preferably formed during fabrication of the semiconductor wafer 14, as part of a sequence of steps to form the pixels of the image sensor 17 and before the packaging assembly 31 including the sidewall 32 and lid wafer 36 are attached to the wafer 14.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic unit comprising:
   a semiconductor element having a front surface and a rear surface remote from the front surface;
   a packaging layer attached to the front surface of the semiconductor element,
   wherein the semiconductor element includes a light detector disposed adjacent to the front surface and aligned with a portion of the rear surface to receive light through the rear surface portion, and a conductive contact at the front surface connected to the light detector, wherein the light detector includes a plurality of light detector elements arranged in an array, wherein the conductive contact is at least partially within the semiconductor element and has a first surface and a second surface remote from the first surface, wherein the conductive contact includes a thin region having a first thickness and thicker region having a second thickness that is thicker than the first thickness, wherein the conductive contact has a hole extending from the first surface through the conductive contact towards the second surface, the hole defining a wall surface extending within the conductive contact from the first surface towards the second surface; and
   a conductive interconnect extending through the packaging layer and the hole of the conductive contact from the first surface towards the second surface so as to contact the wall surface in at least the thicker region of the conductive contact, at least a portion of the conductive interconnect being exposed at a surface of the microelectronic unit.

2. The microelectronic unit of claim 1, wherein the first thickness is ninety percent of the second thickness.

3. The microelectronic unit of claim 1, wherein the first thickness is fifty percent of the second thickness.

4. The microelectronic unit of claim 1 further comprising:
   a packaging assembly attached at the rear surface of the semiconductor element and defining a cavity aligned with the light detector in a direction normal to the rear surface.

5. The microelectronic unit of claim 1, wherein the packaging layer has a thickness of about thirty to one thousand microns.

6. The microelectronic unit of claim 1, wherein the light detector includes a plurality of light elements defining one or more pixels, wherein each pixel has a lateral dimension in a lateral direction along the front surface substantially equal to the thickness of the semiconductor element.

7. The microelectronic unit of claim 1 further comprising:
   a layer including adhesive material attaching the semiconductor element to the packaging layer.

8. The microelectronic unit of claim 1,
   wherein the conductive contact includes a plurality of layers disposed within the semiconductor element and having a third thickness, wherein the semiconductor element has a fourth thickness that is greater than the third thickness,
   wherein the conductive interconnect extends into the conductive contact a depth less than the third thickness, and the conductive interconnect connects to a metal layer of the plurality of layers of the conductive contact.

9. The microelectronic unit of claim 4 further comprising:
   a first dielectric layer disposed on the rear surface of the semiconductor element and to which the packaging assembly is attached through a second dielectric layer.

10. The microelectronic unit of claim 8, wherein the plurality of layers of the conductive contact includes a layer including dielectric material.

11. The microelectronic unit of claim 8, wherein the conductive contact includes a conductive via interconnecting adjacent layers of the plurality of layers.

12. The microelectronic unit of claim 8, wherein the plurality of layers of the conductive contact includes alternating layers of dielectric material and metal.

13. The microelectronic unit of claim 8, wherein the third thickness is a maximum of about 10 microns.

14. The microelectronic unit of claim 9, wherein the first dielectric layer has a thickness of about one to five microns and the second dielectric layer includes an adhesive material.

15. A microelectronic unit comprising:
   a semiconductor element having a front surface and a rear surface remote from the front surface;
   a packaging layer attached to the front surface of the semiconductor element,
   wherein the semiconductor element includes a light detector disposed adjacent to the front surface and aligned with a portion of the rear surface to receive light through the rear surface portion, and a conductive contact at the front surface connected to the light detector, wherein the light detector includes a plurality of light detector elements arranged in an array, wherein the conductive contact includes a thin region having a first thickness and thicker region having a second thickness that is thicker than the first thickness; and
   and at least a portion of the thicker region of the conductive contact, at least a portion of the conductive interconnect being exposed at a surface of the microelectronic unit,
   wherein the thin and thicker regions of the conductive contact extend from the front surface toward the packaging layer,
   wherein the conductive interconnect extends into the conductive contact a depth less than the second thickness.

16. The microelectronic unit of claim 15, wherein the conductive contact includes a first metal layer adjacent the front surface and at least one second metal layer disposed between the first metal layer and the packaging layer.

17. The microelectronic unit of claim 15 further comprising:
a packaging assembly attached at the rear surface of the semiconductor element and defining a cavity aligned with the light detector in a direction normal to the rear surface.

18. The microelectronic unit of claim 16, wherein the first metal layer includes aluminum and the second metal layer includes at least one of nickel, copper, silver or gold.

19. The microelectronic unit of claim 16, wherein the second metal layer is formed by electrode-less plating.

20. The microelectronic unit of claim 16, wherein the second metal layer has a thickness greater than that of the first metal layer.

21. The microelectronic unit of claim 16, wherein the second metal layer has a thickness of about 0.5 to 30 microns.

22. The microelectronic unit of claim 16, wherein the conductive interconnect extends into the conductive contact to a depth so as to terminate between the first metal layer and the packaging layer.

23. A microelectronic unit comprising:
a semiconductor element having a front surface, a rear surface remote from the front surface and a region consisting essentially of semiconductor material disposed between the front and rear surfaces; and
a first packaging layer attached to the front surface of the semiconductor element,
wherein the semiconductor element includes a light detector disposed adjacent to the front surface and aligned with a portion of the rear surface to receive light through the rear surface portion, and a conductive contact at the front surface connected to the light detector, wherein the light detector includes a plurality of light detector elements arranged in an array; and
a packaging assembly having a second packaging layer attached to the rear surface of the semiconductor element,
a conductive interconnect extending through the first packaging layer, through the conductive contact and into the second packaging layer and connected to the conductive contact, wherein the conductive interconnect is electrically isolated from the semiconductor region and at least a portion of the conductive interconnect is exposed at a surface of the microelectronic unit.

24. The microelectronic unit of claim 23, wherein the second packaging layer is attached to a portion of a rear surface of the conductive contact.

25. The microelectronic unit of claim 23 further comprising:
a layer of dielectric material contacting the rear surface portion of the conductive contact and electrically isolating the semiconductor region from the conductive interconnect.

26. The microelectronic unit of claim 23, wherein the semiconductor element includes an isolation region completely circumscribing the conductive contact, the isolation region electrically isolating the conductive contact from the semiconductor region.

27. The microelectronic unit of claim 25, wherein the dielectric layer includes adhesive material.

28. The microelectronic unit of claim 25, wherein the dielectric layer contacts the rear surface of the semiconductor element.

29. The microelectronic unit of claim 26, wherein the isolation region includes dielectric material.

30. The microelectronic unit of claim 26, wherein the isolation region includes semiconductor material having a doping different than a doping of semiconductor material in a region of the semiconductor element adjacent to and circumscribed by the isolation region.

* * * * *

UNITED STATES PATENT AND TRADEMARK OFFICE
CERTIFICATE OF CORRECTION

Page 1 of 1

PATENT NO. : 8,624,342 B2
APPLICATION NO. : 12/940326
DATED : January 7, 2014
INVENTOR(S) : Giles Humpston et al.

It is certified that error appears in the above-identified patent and that said Letters Patent is hereby corrected as shown below:

In The Claims

In column 10, line 60, delete the word "and."

Signed and Sealed this
Nineteenth Day of April, 2016

Michelle K. Lee
*Director of the United States Patent and Trademark Office*